(12) United States Patent
Takatsuka et al.

(10) Patent No.: US 10,684,328 B2
(45) Date of Patent: Jun. 16, 2020

(54) REMAINING BATTERY CHARGE ESTIMATION SYSTEM AND REMAINING BATTERY CHARGE ESTIMATION METHOD

(71) Applicant: OMRON CORPORATION, Kyoto-shi, Kyoto (JP)

(72) Inventors: Hiromasa Takatsuka, Tokyo (JP); Kazuki Kasai, Tokyo (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/758,763

(22) PCT Filed: Nov. 2, 2016

(86) PCT No.: PCT/JP2016/082665
§ 371 (c)(1),
(2) Date: Mar. 9, 2018

(87) PCT Pub. No.: WO2017/094432
PCT Pub. Date: Jun. 8, 2017

(65) Prior Publication Data
US 2019/0041467 A1    Feb. 7, 2019

(30) Foreign Application Priority Data

Dec. 1, 2015  (JP) ................................ 2015-234859

(51) Int. Cl.
*G01R 31/367* (2019.01)
*H01M 10/48* (2006.01)
(Continued)

(52) U.S. Cl.
CPC ............. *G01R 31/367* (2019.01); *B60L 3/12* (2013.01); *B60L 53/305* (2019.02); *B60L 53/60* (2019.02);
(Continued)

(58) Field of Classification Search
CPC ......... B60L 2240/549; B60L 2240/547; B60L 2240/429; B60L 2240/427; G01R 31/367; G01R 31/389
See application file for complete search history.

(56) References Cited

U.S. PATENT DOCUMENTS 5,521,443 A    5/1996  Imura et al.
6,650,089 B1 *  11/2003  Freeman ............... H02J 7/0047
                                                        320/130
(Continued)

FOREIGN PATENT DOCUMENTS

EP    2762907 A1    8/2014
JP    H5-219608 A   8/1993
(Continued)

OTHER PUBLICATIONS

The Verge: Gogoro's electric scooter of the future—CES 2015, URL:https://www.youtube.com/watch?time_continue=1&v=QafvGm9br4o (Retrieved from the Internet on Nov. 23, 2018), Jan. 5, 2015, p. 1-3, Relevance is indicated in the EESR issued on Dec. 3, 2018 in a related European patent application.
(Continued)

*Primary Examiner* — Dominic E Hawkins
(74) *Attorney, Agent, or Firm* — Metrolex IP Law Group, PLLC

(57) ABSTRACT

A remaining battery charge estimation system (1) comprises a connection detector (15), a connected device identification component (17), a memory (16), and a remaining battery charge estimation and resource determination component (18). The connection detector (15) detects connection between a battery pack (10) and a charging device (30). The connected device identification component (17) identifies the connected device. The memory (16) stores information related to a sensor (11) and a CPU (12) used for estimating the remaining battery charge of the battery pack (10),
(Continued)

information related to a sensor (31) and a CPU (32) used for estimating the remaining battery charge of the charging device (30). The remaining battery charge estimation and resource determination component (18) determines the sensor (11, 31) and CPU (12, 32) to be used for estimating the remaining battery charge, stored in the memory (16), on the basis of information related to the connected device identified by the connected device identification component (17).

9 Claims, 8 Drawing Sheets

(51) Int. Cl.
    *H02J 7/00*     (2006.01)
    *B62J 99/00*     (2020.01)
    *B60L 53/30*     (2019.01)
    *B60L 53/60*     (2019.01)
    *B60L 3/12*     (2006.01)
    *B60L 58/12*     (2019.01)
    *G01R 31/389*     (2019.01)
(52) U.S. Cl.
    CPC .............. *B60L 58/12* (2019.02); *B62J 99/00* (2013.01); *G01R 31/389* (2019.01); *H01M 10/48* (2013.01); *H02J 7/00* (2013.01); *H02J 7/0021* (2013.01); *B60L 2240/427* (2013.01); *B60L 2240/429* (2013.01); *B60L 2240/547* (2013.01); *B60L 2240/549* (2013.01); *Y02T 10/7005* (2013.01)

(56) References Cited

U.S. PATENT DOCUMENTS

| | | | |
|---|---|---|---|
| 2006/0152196 A1 | 7/2006 | Matsumoto et al. | |
| 2007/0114971 A1 | 5/2007 | Uesaka et al. | |
| 2009/0132186 A1* | 5/2009 | Esnard | G01R 31/3648 702/63 |
| 2009/0315359 A1 | 12/2009 | Suzuki et al. | |
| 2010/0222952 A1 | 9/2010 | Yamaguchi | |
| 2010/0318252 A1 | 12/2010 | Izumi | |
| 2011/0178745 A1 | 7/2011 | Kobayashi | |
| 2012/0086405 A1 | 4/2012 | Shigemizu et al. | |
| 2012/0098500 A1* | 4/2012 | Vestama | H01M 10/44 320/149 |
| 2013/0127687 A1 | 5/2013 | Yu | |
| 2013/0200845 A1 | 8/2013 | Bito | |
| 2013/0200848 A1 | 8/2013 | Ozawa et al. | |
| 2014/0032141 A1* | 1/2014 | Subbotin | G01R 31/367 702/63 |
| 2014/0095089 A1 | 4/2014 | Wu et al. | |
| 2014/0316728 A1* | 10/2014 | Zhong | G01R 31/367 702/63 |
| 2014/0347012 A1 | 11/2014 | Shim et al. | |
| 2015/0077126 A1* | 3/2015 | Wang | H01M 10/44 324/428 |
| 2015/0119094 A1* | 4/2015 | Bartels | H04W 52/0261 455/518 |
| 2015/0123611 A1 | 5/2015 | Huang | |
| 2016/0003917 A1* | 1/2016 | You | G01R 31/392 702/63 |

FOREIGN PATENT DOCUMENTS

| | | | |
|---|---|---|---|
| JP | H11-102732 | A | 4/1999 |
| JP | 2005-077332 | A | 3/2005 |
| JP | 2009-201197 | A | 9/2009 |
| JP | 2010-4666 | A | 1/2010 |
| JP | 2010-237796 | A | 10/2010 |
| JP | 2011-176958 | A | 9/2011 |
| JP | 2012-90436 | A | 5/2012 |
| JP | 2012-159357 | A | 8/2012 |
| JP | 2013-46512 | A | 3/2013 |
| JP | 2013-154717 | A | 8/2013 |
| JP | 2013-225951 | A | 10/2013 |
| JP | 2014-164853 | A | 9/2014 |
| JP | 2014-190727 | A | 10/2014 |
| JP | 2014-228534 | A | 12/2014 |
| JP | 2014-233783 | A | 12/2014 |
| JP | 2014-535038 | A | 12/2014 |
| WO | 2010/140233 | A1 | 12/2010 |
| WO | 2017/086168 | A1 | 5/2017 |

OTHER PUBLICATIONS

The extended European search report (EESR) dated Dec. 3, 2018 in a related European patent application.
An English translation of the International Search Report of a related international application PCT/JP2016/082622 dated Dec. 20, 2016.
An English translation of the Written Opinion of a related international application PCT/JP2016/082622 dated Dec. 20, 2016.
An English translation of the International Search Report of PCT/JP2016/082665 dated Jan. 17, 2017.
An English translation of the Written Opinion of PCT/JP2016/082665 dated Jan. 17, 2017.
The U.S. Office Action dated Jan. 24, 2019 in a related U.S. Appl. No. 15/758,748.
The EESR issued on Jul. 22, 2019 in a counterpart European patent application.
An office action dated Oct. 15, 2019 in a related Japanese patent application.
An office action dated Aug. 6, 2019 in a related Japanese patent application.
Gogoro, "Gogoro—Introducing the world's first and only Smartscooter(TM)",www.gogoro.com/support, Retrieved from the Internet: URL:http://web.archive.org/web/20150910133644/http://www.gogoro.com/support (retrieved on Jul. 5, 2019), Sep. 10, 2015, XP055602868, Relevance is indicated in the EPOA issued on Aug. 30, 2019 in a related European patent application.
An office action dated Aug. 30, 2019 in a related European patent application.
An office action dated Jan. 7, 2020 in a related Japanese patent application.

* cited by examiner

|  | Battery pack | Charging device |
|---|---|---|
| Installed CPU | low accuracy | high accuracy |
| Installed algorithm | coulomb counting method<br>OCV method | coulomb counting method<br>OCV method<br>Kalman filter method |
| Installed sensor | current sensor (low accuracy)<br>voltage sensor (low accuracy) | current sensor (high accuracy) |

FIG. 3

|  | | Estimation accuracy priority mode (mode A) | | Consumed power priority mode (mode G) | |
| --- | --- | --- | --- | --- | --- |
|  |  | Selected resource | Installed in: | Selected resource | Installed in: |
| CPU | | high accuracy | charging device | low accuracy | battery P |
| Algorithm | | Kalman filter method | charging device | coulomb counting method | battery P |
| Sensor | | current sensor (high accuracy) | charging device | current sensor (high accuracy) | charging device |
|  | | voltage sensor (low accuracy) | battery P | — | |

FIG. 4

| | Algorithm | CPU | Sensor | Accuracy | Power consumption | Processing speed |
|---|---|---|---|---|---|---|
| Mode A | Kalman filter method | high accuracy | Current (high accuracy) | 1 | 5 | 2 |
| Mode B | Kalman filter method | low accuracy | Current (high accuracy) | 2 | 2 | 4 |
| Mode C | Kalman filter method | high accuracy | Current (high accuracy) Voltage (low accuracy) | 2 | 5 | 2 |
| ⋮ | | | | | | |
| Mode G | coulomb counting method | low accuracy | Current (high accuracy) | 6 | 1 | 2 |
| ⋮ | | | | | | |
| Mode K | OCV method | low accuracy | Voltage (low accuracy) | 7 | 1 | 2 |
| ⋮ | | | | | | |

※a smaller numerical value means that the performance is higher

FIG. 5

REMAINING BATTERY CHARGE ESTIMATION SYSTEM AND REMAINING BATTERY CHARGE ESTIMATION METHOD

FIELD

The present invention relates to a remaining battery charge estimation system and a remaining battery charge estimation method for estimating the remaining charge of a battery pack.

BACKGROUND

A battery pack that is repeatedly used and charged by a charger is used in a state of being connected to any of various connected devices, such as a charger or a power consumption element.

Since there is generally no way to directly measure the remaining battery charge of a battery pack, it is estimated using a measurement history or the like in which changes in physical quantities such as voltage, current, impedance, and temperature are recorded.

For example, Patent Literature 1 discloses a battery pack management system in which, if the SoC of a battery estimated using the charging and discharging current, the battery voltage, the battery temperature, and so forth is less than or equal to a reference SoC, then a reference remaining capacity, the current battery voltage, and so forth are used to estimate the current SoC.

CITATION LIST

Patent Literature

Patent Literature 1: JP-A 2014-228534
Patent Literature 2: JP-A 2014-190727
Patent Literature 3: JP-A 2011-176958
Patent Literature 4: JP-A 2014-535038

SUMMARY

However, the following problems are encountered with the above-mentioned conventional remaining battery charge estimation system.

The remaining battery charge estimation systems disclosed in the above publications do not take into consideration the idea of combining the resources installed in the battery pack and the connected device for more effective utilization.

It is an object of the present invention to provide a remaining battery charge estimation system and a remaining battery charge estimation method with which the remaining battery charge can be estimated more accurately than with prior art.

The remaining battery charge estimation system pertaining to the first invention is a remaining battery charge estimation system for estimating the remaining battery charge of a battery pack, the system comprising a connection detector, a connected device identification component, a storage component, and a remaining battery charge estimation and resource determination component. The connection detector detects the connection of the battery pack and a connected device to which the battery pack is connected. The connected device identification component identifies the connected device. The storage component stores information related to first resources of the battery pack and information related to second resources of the connected device, which are used for estimating the remaining battery charge. The remaining battery charge estimation and resource determination component determines the first resources and the second resources stored in the storage component and used for estimating the remaining battery charge, on the basis of the information related to the connected device identified by the connected device identification component.

Here, when estimating the remaining battery charge of a battery pack, the accuracy of estimating the remaining battery charge is improved by using the first resources on the battery pack side and the second resources on the side of the connected device connected to the battery pack.

Here, the connected device to which the battery pack is connected may be, for example, a charging device that charges battery packs, various power consumption elements in which the battery pack is installed, or the like. The first resources on the battery pack side and the second resources on the connected device side include, for example, a calculation resource such as a CPU or GPU (graphic processing unit), an algorithm used for estimating the remaining battery charge, and a sensor or other such measurement resource for measuring battery voltage and current, impedance, and the like. In estimating the remaining battery charge, the first resources on the battery pack side and the second resources on the connected device side may be used in combination, or only the first resources or only the second resources may be used.

The connection detector, the connected device identification component, the storage component, and the remaining battery charge estimation and resource determination component may each be provided on the battery pack side or on the connected device side. Alternatively, they may be provided spanning from the battery pack to the connected device.

Consequently, the remaining battery charge can be estimated using the combination of the first resources and the second resources that affords the most accurate estimation, for example.

As a result, the accuracy of estimating the remaining battery charge can be improved over that in the past.

The remaining battery charge estimation system pertaining to the second invention is the remaining battery charge estimation system pertaining to the first invention, wherein the first resources and the second resources include a calculation resource having a calculation function, a measurement resource for measuring voltage, current, and impedance, and an algorithm for estimating the remaining battery charge.

Here, a calculation resource such as a CPU or a GPU, a any of various kinds of sensor or other such measurement resource, any of various kinds of algorithm used for estimating the remaining battery charge, or the like is used as the first resources on the battery pack side and the second resources on the connected device side.

Consequently, the remaining battery charge can be efficiently and accurately estimated by using the resources on the battery pack side and the connected device side and deciding on the optimal combination.

The remaining battery charge estimation system pertaining to the third invention is the remaining battery charge estimation system pertaining to the first or second invention, wherein the remaining battery charge estimation and resource determination component estimates the remaining battery charge by combining the first resources and the second resources.

Here, at least one of the first resources on the battery pack side and at least one of the second resources on the connected device side are combined to estimate the remaining battery charge.

Consequently, various resources provided on the battery pack side and the connected device side can be effectively utilized, and accurate estimation of the remaining battery charge can be performed by using the optimal combination.

The remaining battery charge estimation system pertaining to the fourth invention is the remaining battery charge estimation system pertaining to any of the first to third inventions, wherein the remaining battery charge estimation and resource determination component selects the first resources and the second resources on the basis of any one of the remaining battery charge estimation accuracy, estimation speed, and power consumption required for estimation.

Here, the first resources and the second resources used for battery estimation are selected on the basis of elements such as accuracy of battery estimation, estimation speed, power consumption, and the like.

Consequently, the remaining battery charge can be estimated effectively and accurately by using the first and second resources so that combinations including CPUs, sensors, algorithms and the like having the highest estimation accuracy will be selected preferentially, for example.

When estimation accuracy of at least a specific value can be ensured, for example, the first and second resources may be used so that a combination including a CPU or the like having a high estimation processing speed, or a combination including a CPU or the like having the lowest power consumption will be selected.

The remaining battery charge estimation system pertaining to the fifth invention is the remaining battery charge estimation system pertaining to any of the first to fourth inventions, wherein the storage component stores the first resources and the second resources determined to be used for estimating the remaining battery charge in the remaining battery charge estimation and resource determination component.

Here, the combination of the first resources and the second resources used when estimating the remaining battery charge is stored in the storage component.

Consequently, when battery estimation is performed under the same conditions during estimation of the remaining battery charge the next time, the remaining battery charge can be estimated more efficiently, more accurately, or with less power consumption by reading out and using the combination selected in the past.

The remaining battery charge estimation system pertaining to the sixth invention is the remaining battery charge estimation system pertaining to any of the first to fifth inventions, wherein the connected device is a charging device.

Here, a charging device that charges battery packs is used as the connected device to which the battery pack is connected.

Consequently, when it is detected that a battery pack has been placed in the charging device, estimation of the remaining battery charge can be performed efficiently and accurately by using the first resources on the battery pack side and the second resources on the charging device side.

The remaining battery charge estimation system pertaining to the seventh invention is the remaining battery charge estimation system pertaining to any of the first to fifth inventions, wherein the connected device is any one of a vehicle, a household appliance, and an electric power tool.

Here, a vehicle, a home appliance, or an electric power tool in which a battery pack is installed is used as the connection device to which a battery pack is connected.

The vehicle here includes, for example, an electric motorcycle or the like that is propelled by power from a battery pack. Examples of home appliances include refrigerators, washing machines, vacuum cleaners, rice cookers, electric kettles, and the like that function under electric power from a battery pack. Electric power tools include, for example, electric drills, electric saws, and the like operated by a battery pack.

Consequently, when it is detected that a battery pack has been installed in a vehicle, a household appliance, an electric power tool, or the like, the first resources on the battery pack side and the second resources in the vehicle, etc., can be used to estimate the remaining battery charge efficiently and accurately, or to estimate the remaining battery charge with less power consumption.

The remaining battery charge estimation system pertaining to the eighth invention is the remaining battery charge estimation system pertaining to the seventh invention, wherein the vehicle includes an electric motorcycle, an electric bicycle, an electrically assisted bicycle, an electric automobile, and a PHV (plug-in hybrid vehicle).

Here, an electric motorcycle, an electric bicycle, or the like is used as a vehicle, which is a connected device.

Consequently, the remaining battery charge can be accurately estimated in a vehicle with which a battery pack whose remaining capacity is low is exchanged for a charged battery pack at a specific battery station, for example.

The remaining battery charge estimation method pertaining to the ninth invention is a remaining battery charge estimation method for estimating the remaining battery charge of a battery pack, the method comprising a connection detection step, a connected device identification step, and a remaining battery charge estimation and resource determination step. The connection detection step involves detecting the connection of the battery pack and a connected device to which the battery pack is connected. The connected device identification step involves identifying the connected device. The remaining battery charge estimation and resource determination step involves determining the first resources had by the battery pack and the second resources had by the connected device, which are used for estimating the remaining battery charge, on the basis of information related to the connected device identified in the connected device identification step.

Here, when estimating the remaining battery charge of a battery pack, the accuracy of estimating the remaining battery charge is improved by using the first resources on the battery pack side and the second resources on the side of the connected device connected to the battery pack.

Here, examples of the connected device to which the battery pack is connected include a charging device that charges battery packs, and various kinds of power consumption element in which battery packs are installed. The first resources on the battery pack side and the second resources on the connected device side include, for example, calculation resources such as a CPU or a GPU (graphic processing unit), an algorithm used for estimating the remaining battery charge, and a sensor or other such measurement resource for measuring battery voltage and current, impedance, and the like. In estimating the remaining battery charge, the first resources on the battery pack side and the second resources on the connected device side may be used in combination, or only the first resources or only the second resources may be used.

Consequently, the remaining battery charge can be estimated using the combination of the first resources and the second resources that affords the most accurate estimation, for example.

As a result, the accuracy of estimating the remaining battery charge can be improved over that in the past.

Effects

With the remaining battery charge estimation system of the present invention, the remaining charge of a battery pack can be estimated more accurately than with a conventional method.

BRIEF DESCRIPTION OF THE DRAWINGS

FIG. 3 is a table comparing the CPUs, algorithms, and sensors installed in the battery pack and charging device included in the remaining battery charge estimation system in FIG. 2;

FIG. 4 is a table showing the details of estimation conditions (mode) of the remaining battery charge in the remaining battery charge estimation system in FIG. 2;

FIG. 5 is a table showing the estimation conditions for the remaining battery charge in FIG. 4 for each mode;

DETAILED DESCRIPTION

The remaining battery charge estimation system 1 pertaining to an embodiment of the present invention will now be described through reference to FIGS. 1 to 6.

Figure 1:
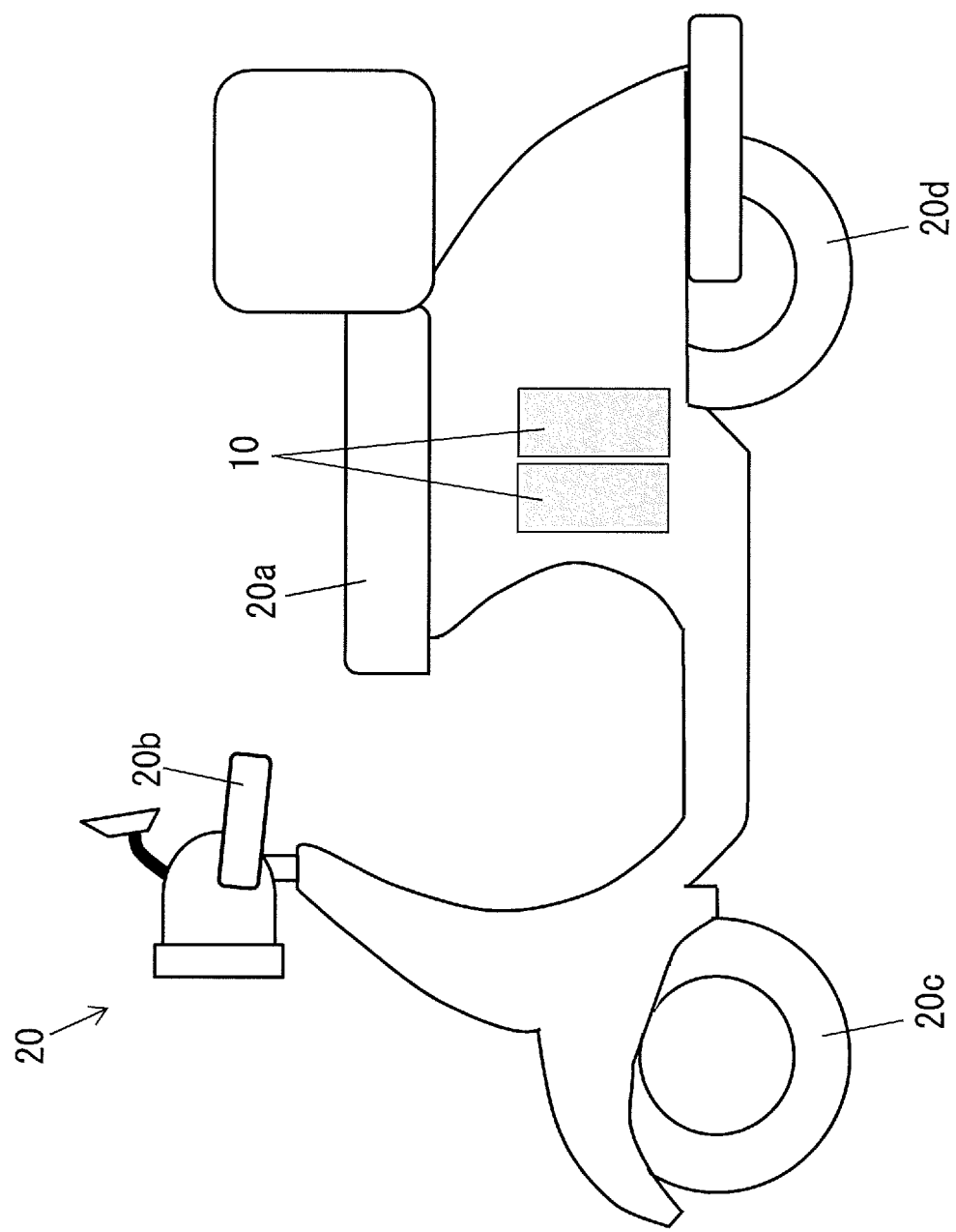
FIG. 1 is a diagram showing the configuration of a vehicle in which a battery pack included in the remaining battery charge estimation system pertaining to an embodiment of the present invention has been installed.

As shown in FIG. 1, the remaining battery charge estimation system 1 pertaining to this embodiment estimates the remaining battery charge of battery packs 10 installed in an exchangeable state in the vehicle 20 (an electric motorcycle or the like).

As shown in FIG. 1, the battery packs 10 are secondary batteries for supplying power to the vehicle 20, and two battery packs 10 are installed in an exchangeable state in the vehicle 20. The battery packs 10 are repeatedly used and charged with a charging device 30 (see FIG. 2) installed at a specific battery station.

The vehicle 20 is an electric motorcycle that is propelled when supplied with power from the two battery packs 10 installed below a seat 20a, and is equipped with a front wheel 20c and a rear wheel (drive wheel) 20d.

The front wheel 20c is a steered wheel provided between the front part of the vehicle 20 and the road surface, and the travel direction can be varied by changing the orientation in conjunction with the orientation of a handle bar 20b.

The rear wheel 20d is a drive wheel provided between the road surface and the rear part of the vehicle 20 where the battery packs 10 are installed, and is rotationally driven by a motor (not shown).

Figure 2:
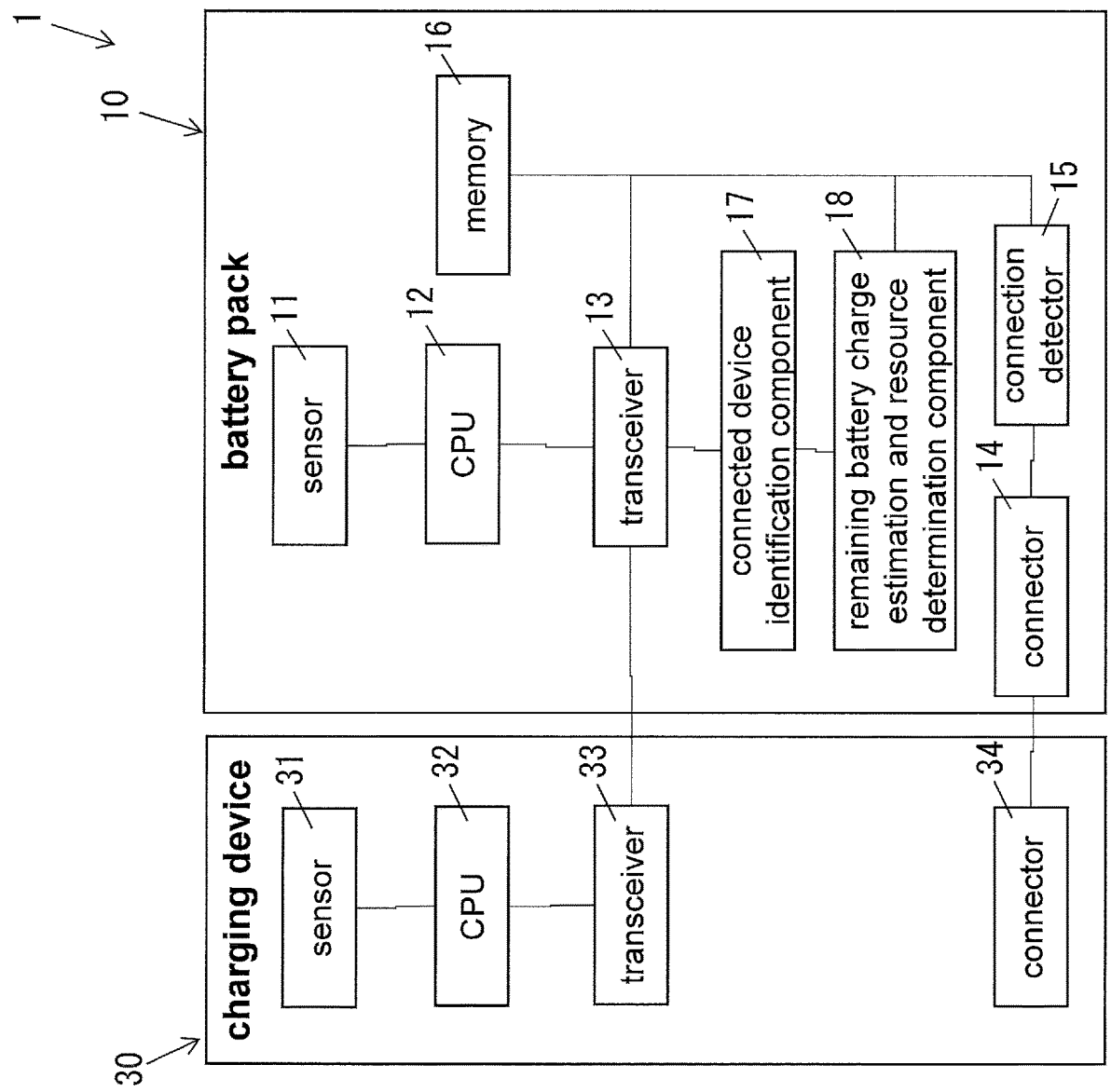
FIG. 2 is a control block diagram showing the configuration of the remaining battery charge estimation system pertaining to an embodiment of the present invention.

As shown in FIG. 2, in the remaining battery charge estimation system 1 in this embodiment performs estimation of the remaining battery charge of the battery packs 10 in a state in which the battery packs 10 are connected to a connected device (in this embodiment, the charging device 30).

Configuration of Battery Pack 10

As shown in FIG. 2, the battery pack 10 includes a sensor (first resource, measurement resource) 11, a CPU (central processing unit) (first resource, calculation resource) 12, a transceiver 13, a connector 14, a connection detector 15, a memory (storage component) 16, a connected device identification component 17, and a remaining battery charge estimation and resource determination component 18.

The sensor (first resource, measurement resource) 11 performs the measurement of various data and the measurement of data necessary for estimating the remaining battery charge of the battery pack 10. More specifically, the sensor 11 measures one or more of voltage, current, and internal impedance in the cells of the battery pack 10.

In this embodiment, a sensor 11 such as a current sensor, a voltage sensor, or the like is installed in the battery pack 10, for example. As shown in FIG. 3, a current sensor and a voltage sensor installed on the battery pack 10 side have lower accuracy than a sensor 31 (current sensor) installed in the charging device 30.

As shown in FIG. 2, the CPU (first resource, calculation resource) 12 is connected to the sensor 11, and performs various kinds of control related to the battery pack 10. The CPU 12 calculates an estimated value of the remaining battery charge of the battery pack 10 using the measurement result for the data necessary for estimating the remaining battery charge of the battery pack 10, and the algorithm stored in the memory 16. More specifically, the CPU 12 calculates an estimated value of the remaining battery charge by using an algorithm such as coulomb counting method stored in the memory 16, along with history information about the current value of the battery pack 10 measured by the sensor 11.

In this embodiment, as shown in FIG. 3, the CPU 12 installed in the battery pack 10 is less accurate at estimating remaining battery charge than the CPU 32 installed in the charging device 30. Also, as shown in FIG. 3, algorithms that can be used for estimating the remaining battery charge by the CPU 12 include coulomb counting method, OCV (open circuit voltage) method, and so forth.

Here, coulomb counting method is a method of calculating the remaining battery charge by measuring the current in and out of the battery pack 10, and is also called the current integration method. In coulomb counting method, the amount of current accumulated during charging is integrated using a current detection resistor, and the amount of current during discharge is found to calculate the remaining battery charge. Estimation of the remaining battery charge by coulomb counting method is generally characterized by higher accuracy than that of a voltage measurement method (see, for example, Patent Literature 2).

The OCV method is a method for estimating the open circuit voltage (OCV) from the closed circuit voltage (CCV) and estimating the remaining battery charge by using a table showing the correlation between the open circuit voltage (OCV) and the remaining battery charge (see, for example, Patent Literature 3). In general, the remaining battery charge estimated by the OCV method is less accurate than the value estimated by some other method (see mode K in FIG. 5).

The transceiver 13 is connected to the CPU 12, the memory 16, the connected device identification component 17, and so on. When the connection detector 15 detects that the battery pack 10 is connected to the charging device 30, the transceiver 13 communicates with a transceiver 33 on the charging device 30 side. More specifically, the transceiver 13 acquires information about the sensor 31, the CPU 32, etc., installed on the charging device 30 side to which the battery pack 10 is connected, via the transceiver 33.

The connector 14 is a connecting portion with the charging device 30 provided on the battery pack 10 side, and makes contact with a connector 34 on the charging device 30 side when the battery pack 10 is placed in the charging device 30. The connector 14 is connected to the connection detector 15.

When the battery packs 10 are placed in the charging device 30, such as when the battery packs 10 are charged, the connection detector 15 detects that the connector 14 on the battery pack 10 side and the connector 34 on the charging device 30 side have made contact, thereby detecting that the battery packs 10 and the charging device 30 are in a connected state. The connection detector 15 then transmits the detection result to the transceiver 13.

This puts the transceiver 13 in a state of being able communicate with the transceiver 33 on the charging device 30 side.

As shown in FIG. 3, the memory (storage component) 16 stores information related to the second resources (the sensor 31, the CPU 32, an algorithm) on the charging device 30 side, acquired via the transceiver 13, and stores information related to the first resources (the sensor 11, the CPU 12, an algorithm) on the battery pack 10 side.

Also, as shown in FIG. 4, the memory 16 stores estimation conditions for each of a plurality of modes that have been set in relation to the estimation of the remaining battery charge using the first resources on the battery pack 10 side and the second resources on the charging device 30 side.

As shown in FIG. 4, examples of the modes stored in the memory 16 include an estimation accuracy priority mode in which resources with higher accuracy in estimating the remaining battery charge are preferentially selected, a consumed power priority mode in which resources that require less power for estimating the remaining battery charge are preferentially selected, and so forth.

As shown in FIG. 5, a number of these modes are prepared in advance in the memory 16. For example, the estimation accuracy priority mode shown in FIG. 4 corresponds to mode A shown in FIG. 5, and the consumed power priority mode shown in FIG. 4 corresponds to mode G shown in FIG. 5.

For example, in the estimation accuracy priority mode (mode A), as shown in FIG. 5, a combination of the resources on the battery pack 10 side and the charging device 30 side is selected so that the estimation accuracy of the remaining battery charge will be the highest.

More specifically, in the estimation accuracy priority mode, as shown in FIG. 4, the algorithm employs the Kalman filter method on the charging device 30 side, and the CPU 32 and the current sensor (sensor 31) on the charging device 30 side (higher accuracy) and the voltage sensor (sensor 11) on the battery pack 10 side are used to estimate the remaining battery charge.

In the consumed power priority mode, as shown in FIG. 5, a combination of the resources on the battery pack 10 side and the charging device 30 side is selected so that the amount of power required for estimating the remaining battery charge of the battery pack 10 is reduced.

More specifically, in the consumed power priority mode, as shown in FIG. 4, the algorithm employs the coulomb counting method, and the CPU 12 on the battery pack 10 side (lower power consumption) and the current sensor on the charging apparatus 30 side (sensor 31) are used to estimate the remaining battery charge. The current sensor on the charging device 30 side has about the same low power consumption as the sensor 11 on the battery pack 10 side. Therefore, in mode G, the current sensor (sensor 31) on the charging device 30 side is used so as to be able to estimate the remaining battery charge with high accuracy while satisfying the condition that the power consumption be low.

In addition, when the processing speed when estimating the remaining battery charge is given priority, as shown in FIG. 5, a processing speed priority mode (mode B) having the highest processing speed is selected.

For the algorithm corresponding to each mode shown in FIG. 5, the Kalman filter method is used by the CPU 32 on the charging device 30 side. The coulomb counting method and the OCV method are used by both the CPU 12 on the battery pack 10 side and the CPU 32 on the charging apparatus 30 side.

For the CPU corresponding to each mode shown in FIG. 5, "high accuracy" means the CPU 32 installed on the charging device 30. On the other hand, "low accuracy" means the CPU 12 installed on the battery pack 10.

Furthermore, for the sensor corresponding to each mode shown in FIG. 5, "high accuracy" means the sensor 31 (current sensor) installed in the charging device 30. On the other hand, "low accuracy" means the sensor 11 (current sensor, voltage sensor) installed in the battery pack 10.

Also, a smaller numerical value in the columns for accuracy, power consumption, and processing speed shown in FIG. 5 means that the performance is higher.

The connected device identification component 17 identifies the connected device as being the charging device 30 on the basis of the information about the connected device (the charging device 30) acquired via the transceiver 13. Then, when the connected device identification component 17 identifies the connected device as being the charging device 30, information about the second resources installed in the charging device 30, such as the sensor 31 and the CPU 32, is stored in the memory 16.

The remaining battery charge estimation and resource determination component 18 refers to the information about the second resources installed in the charging device 30 identified by the connected device identification component 17 and the information about the first resources installed in the battery packs 10, and estimates the remaining battery charge of the battery packs 10.

More specifically, either the first resources on the battery pack 10 side or the second resources on the charging device 30 side are selected as the resources to be used for estimating the remaining battery charge, on the basis of the preset conditions (mode).

Here, as described above, for example, when the remaining battery charge is estimated in the mode with the highest estimation accuracy, as shown in FIG. 4, the remaining battery charge estimation and resource determination component 18 uses the sensor 31, the CPU 32, and the algorithm installed in the charging device 30, selects the current sensor (sensor 11) installed in the battery packs 10, and estimates the remaining battery charge.

On the other hand, as described above, when estimating the remaining battery charge in the mode with the lowest power consumption, for example, as shown in FIG. 4, the remaining battery charge estimation and resource determination component 18 uses the CPU 12 and the algorithm installed in the battery packs 10, selects the current sensor (sensor 31) installed in the charging device 30, and estimates the remaining battery charge.

Consequently, the remaining battery charge of the battery packs 10 can be estimated under the optimal conditions by appropriately combining the algorithms, CPUs, sensors, and other resources (first and second resources) installed in the battery packs 10 and in the connected device (charging device 30) to which the battery packs 10 are connected.

Configuration of Charging Device 30

The charging device 30 is installed in a specific battery station in order to charge the above-mentioned battery packs 10. As shown in FIG. 2, the charging device 30 comprises the sensor (second resource, measurement resource) 31, the CPU (second resource, calculation resource) 32, the transceiver 33, and the connector 34.

The sensor (second resource, measurement resource) 31 performs measurement of various kinds of data and measurement of the data necessary for estimating the remaining battery charge of the battery packs 10. More specifically, the sensor 31 measures one or more of the following: voltage, current, and internal impedance of the battery packs 10.

In this embodiment, a sensor 31 such as a current sensor is installed in the charging device 30, for example. As shown in FIG. 3, the current sensor installed on the charging device 30 side is one having higher accuracy than the sensor 11 (current sensor, voltage sensor) installed in the battery packs 10.

As shown in FIG. 2, the CPU (second resource, calculation resource) 32 is connected to the sensor 31, and performs various kinds of control related to the charging device 30. The CPU 32 calculates an estimated value of the remaining battery charge of the battery packs 10 by using the measurement result for the data necessary to estimate the remaining battery charge of the battery packs 10. More specifically, the CPU 32 calculates an estimated value of the remaining battery charge by using, for example, an algorithm such as the Kalman filter method together with history information for the current value of the battery packs 10 measured by the sensor 31.

In this embodiment, as shown in FIG. 3, the CPU 32 installed in the charging device 30 is one having higher accuracy in estimating the remaining battery charge than the CPU 12 installed in the battery packs 10. As shown in FIG. 3, in addition to the above-mentioned coulomb counting method and the OCV (open circuit voltage) method, the Kalman filter method and the like can also be employed as the algorithm used by the CPU 32 for estimating the remaining battery charge.

Here, the Kalman filter method is a method for estimating the remaining battery charge by using a Kalman filter, and generally has an advantage in that its estimation accuracy is higher than that of the above-mentioned coulomb counting method or OCV method (see, for example, Patent Literature 4).

The transceiver 33 is connected to the CPU 32. Then, in a state in which the battery packs 10 are connected to the charging device 30, the transceiver 33 communicates with the transceiver 13 on the battery pack 10 side. More specifically, the transceiver 33 transmits information about the sensor 31, the CPU 32, etc., installed on the charging device 30 side to the battery packs 10 side via the transceiver 13.

The connector 34 is a connecting portion with the battery packs 10 provided on the charging device 30 side, and is in contact with the connector 14 on the battery pack 10 side when the battery packs 10 are placed in the charging device 30.

Remaining Battery Charge Estimation Method

Figure 6:
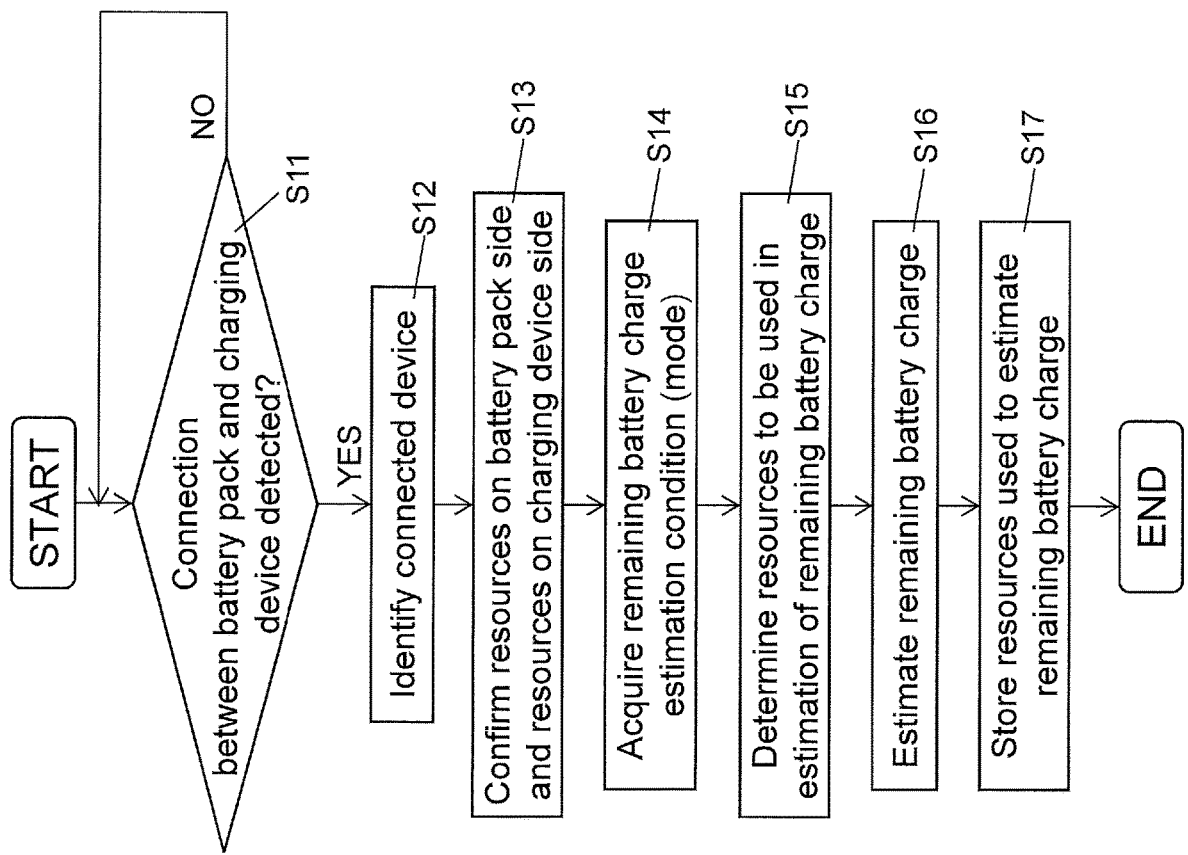
FIG. 6 is a flowchart showing the flow of the remaining battery charge estimation method in the remaining battery charge estimation system in FIG. 2.

The remaining battery charge estimation system 1 in this embodiment has the configuration discussed above, and estimates the remaining battery charge according to the flowchart shown in FIG. 6.

That is, in step S11, it is confirmed whether or not a connection between the battery pack 10 and the charging device 30 has been detected. If a connection is detected, the flow proceeds to step S12.

Next, in step S12, the connected device to which the battery packs 10 are connected is identified. In this embodiment, the charging device 30 is identified as a connected device.

Next, in step S13, information such as the type and performance of the resources (first and second resources) installed on the battery pack 10 side and the side of the charging device 30 identified as the connected device is checked. This information can be acquired from the charging device 30 via the transceivers 13 and 33, and information stored in the memory 16 can also be used.

Next, in step S14, the remaining battery charge estimation condition (mode) is acquired. A preset mode may be selected directly as the estimation condition, or a mode selected and inputted by the user may be selected.

Examples of estimation conditions (modes), as discussed above, include an estimation accuracy priority mode (mode A in FIG. 5) that gives priority to estimation accuracy, a consumed power priority mode (mode G in FIG. 5) in which power consumption is suppressed, and a processing speed priority mode (mode B in FIG. 5) that gives priority to processing speed.

Next, in step S15, in order to satisfy the estimation condition selected in step S14, the optimal resources are selected from among the first resources (sensor 11, CPU 12, and algorithm) on the battery pack 10 side and the second resources (sensor 31, CPU 32, and algorithm) on the charging device 30 side.

For example, in the estimation accuracy priority mode, as shown in FIG. 4, the sensor 31, the CPU 32, and an algorithm (Kalman filter method) having the highest accuracy are selected so that estimation of the remaining battery charge can be performed at the highest accuracy.

In the consumed power priority mode, as shown in FIG. 4, the sensor 31, the CPU 12, and an algorithm (coulomb counting method) are selected so that estimation of the remaining battery charge can be performed with less power consumption, albeit at a lower accuracy.

Next, in step S16, the remaining battery charge of the battery packs 10 is estimated using the resources selected in step S15.

Next, in step S17, the combination of resources used for estimating the remaining battery charge in step S16 is stored in the memory 16.

With the remaining battery charge estimation method in this embodiment, as discussed above, the connection state between the battery packs 10 and the charging device 30 is sensed, the connected device is identified as being the charging device 30, and the first resources on the battery pack 10 side and the second resources on the charging device 30 side are used to select an optimal combination of resources according to the estimation condition.

Consequently, the remaining battery charge can be estimated using the optimal combination, taking advantage of the second resources on the charging device 30 side, according to various modes, without depending on the performance of the sensor 11, the CPU 12, the algorithm, and so forth installed on the battery pack 10 side.

Other Embodiments

An embodiment of the present invention was described above, but the present invention is not limited to or by the above embodiment, and various modifications are possible without departing from the gist of the invention.

(A)

In the above embodiment, as shown in FIG. 2, an example was given in which the resources to be used in the estimation of the remaining battery charge were determined in a state in which the battery packs 10 were connected to the charging device 30 disposed at a battery station. However, the present invention is not limited to this.

Figure 7:
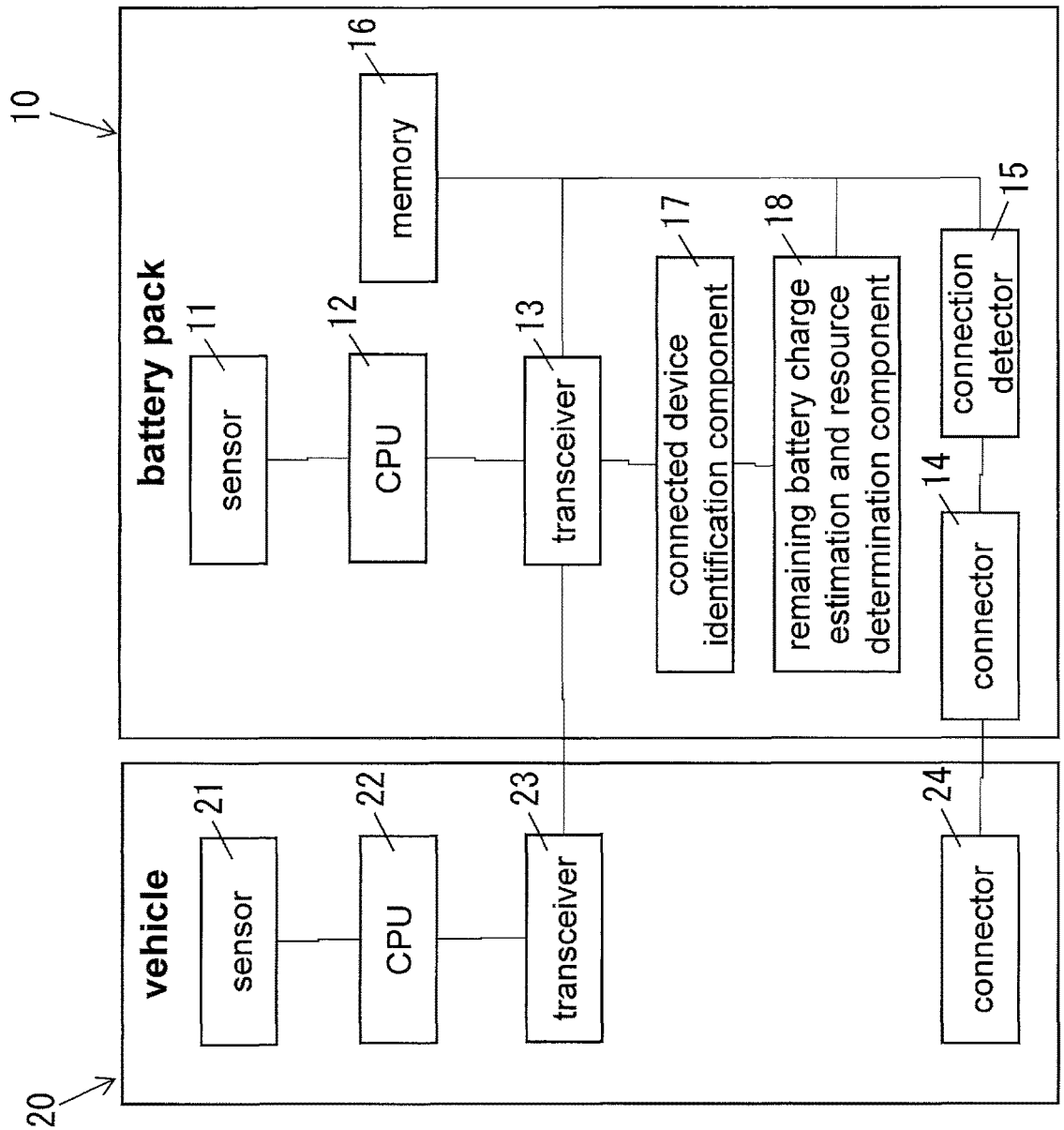
FIG. 7 is a control block diagram showing the configuration of the remaining battery charge estimation system pertaining to another embodiment of the present invention.

For example, as shown in FIG. 7, the configuration may be such that the resources to be used in the estimation of the remaining battery charge are determined in a state in which the battery packs 10 are connected to the vehicle 20.

That is, instead of the charging device, the vehicle 20 may be used as the connected device in the remaining battery charge estimation system of the present invention.

In this case, it may be determined whether or not to use the resources on the vehicle 20 side (the sensor 21, the CPU 22, etc.) as the resources used for estimating the remaining battery charge.

Consequently, just as in the above embodiment, when the connection detector 15 detects a connection between the connector 14 on the battery pack 10 side and the connector 24 on the vehicle 20 side, the transceiver 13 and the transceiver 23 communicate with each other to identify the connected device, and the resources for estimating the remaining battery charge can be determined.

(B)

In the above embodiment, an example was given in which the battery packs 10 were installed in the vehicle 20 shown in FIG. 1. However, the present invention is not limited to this.

For example, instead of a vehicle, the connected device in which the battery pack is installed may be an electric power tool (an electric drill, an electric cutter, etc.) or a home appliance (a refrigerator, a washing machine, a fan, etc.).

Figure 8:
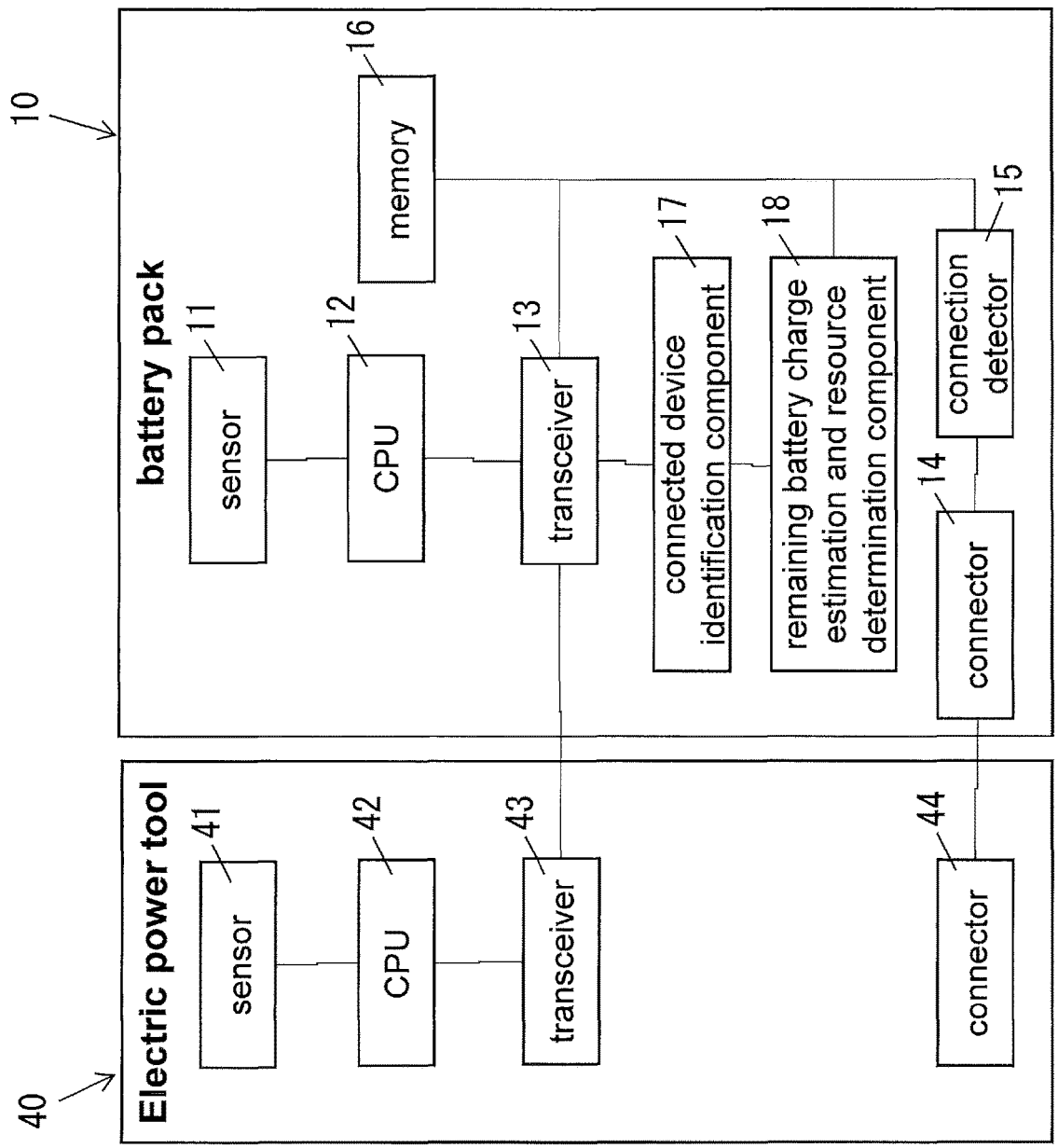
FIG. 8 is a control block diagram showing the configuration of the remaining battery charge estimation system pertaining to yet another embodiment of the present invention.

For example, when the battery pack 10 is installed in an electric power tool 40, as shown in FIG. 8, it may be determined whether or not to use the resources on the electric power tool 40 side (sensor 41, CPU 42, etc.) as the resources used for estimating the remaining battery charge.

In this case, just as in the above embodiment, when the connection detector 15 detects a connection between the connector 14 on the battery pack 10 side and the connector 44 on the electric power tool 40 side, the transceiver 13 and the transceiver 43 communicate with each other to identify the connected device and determine the resources for estimating the remaining battery charge.

(C)

In the above embodiment, an example was given in which the connection detector 15, the connected device identification component 17, and the remaining battery charge estimation and resource determination component 18 that constitute the remaining battery charge estimation system 1 are all disposed on the battery pack 10 side. However, the present invention is not limited to this.

For example, at least some of the above components may be disposed on the charging device 30 side, that is, on the connected device side.

(D)

In the above embodiment, an example was given in which the sensor 11 and the CPU 12 were used as the first resources provided on the battery pack 10 side as shown in FIG. 2. However, the present invention is not limited to this.

For example, only a sensor may be used as a resource on the battery pack side. That is, the configuration may be such that no CPU is provided on the battery pack side.

In this case, the remaining battery charge can be estimated by using a CPU or the like that is a calculation resource on the connected device side.

(E)

In the above embodiment, an example was given in which the CPUs 12 and 32 were used as a calculation resource on the battery pack 10 side and a calculation resource on the charging device 30 (the connected device) side. However, the present invention is not limited to this.

For example, a GPU (graphic processing unit) or FPGA (field-programmable gate array) may be used as a calculation resource used for battery estimation instead of a CPU.

(F)

In the above embodiment, an example was given in which the sensors 11 and 31 for measuring voltage, current, internal impedance, etc., were used as measurement resources on the battery pack 10 side and the charging device 30 side. However, the present invention is not limited to this.

For example, a sensor that performs measurement of only one of voltage, current, and internal impedance may be provided as a measurement resource on the battery pack side and the connected device side.

(G)

In the above embodiment, an example was given in which two battery packs 10 were installed in the vehicle 20. However, the present invention is not limited to this.

For example, one battery pack or three or more battery packs may be installed in a connected device such as a vehicle.

(H)

In the above embodiment, an example was given in which the battery packs 10 were installed under the seat 20a in the vehicle 20. However, the present invention is not limited to this.

For example, the battery packs 10 may be located at some other location, such as under the handle bar 20b in the vehicle 20.

(I)

In the above embodiment, an example was given in which the vehicle 20 in which the battery packs 10 were installed was the electric motorcycle shown in FIG. 1. However, the present invention is not limited to this.

For example, the vehicle in which the battery packs are installed may be some other vehicle besides an electric motorcycle, such as an electric unicycle, an electric bicycle, an electrically assist bicycle, an electric automobile (EV), a PHV (plug-in hybrid vehicle), or the like.

Alternatively, the connected device in which the battery packs are installed is not limited to a vehicle, and may be some other electric product that is driven by a replaceable battery.

Examples of electric products include household electric appliances such as a refrigerator, a washing machine, a vacuum cleaner, a rice cooker, and an electric kettle, which function under power from a battery pack.

INDUSTRIAL APPLICABILITY

The remaining battery charge estimation system of the present invention has the effect of improving the accuracy of estimating the remaining charge of a battery pack over that in the past, and therefore can be widely applied to various systems that estimate the remaining battery charge.

REFERENCE SIGNS LIST 1 remaining battery charge estimation system
3 battery station
10 battery pack
11 sensor (first resource, measurement resource)
12 CPU (first resource, calculation resource)
13 transceiver
14 connector
15 connection detector
16 memory (storage component)
17 connected device identification component
18 remaining battery charge estimation and resource determination component
20 vehicle (connected device)
20a seat
20b handle bar
20c front wheel
20d rear wheel
21 sensor (second resource, measurement resource)
22 CPU (second resource, calculation resource)
23 transceiver
24 connector
30 charging device (connected device)
31 sensor (second resource, measurement resource)
32 CPU (second resource, calculation resource)
33 transceiver
34 connector
40 electric power tool (connected device)
41 sensor (second resource, measurement resource)
42 CPU (second resource, calculation resource)
43 transceiver
44 connector

The invention claimed is:

1. A remaining battery charge estimation system for estimating a remaining battery charge of a battery pack, the system comprising:
   a connection detector configured to detect a connection of the battery pack and a connected device to which the battery pack is connected;
   a connected device identification component configured to identify the connected device;
   a storage component configured to store information related to first resources installed in the battery pack and information related to second resources installed in the connected device, which are used for estimating the remaining battery charge; and
   a remaining battery charge estimation and resource determination component configured to determine the first resources and the second resources stored in the storage component and used for estimating the remaining battery charge, on the basis of the information related to the connected device identified by the connected device identification component.

2. The remaining battery charge estimating system according to claim 1,
   wherein the first resources and the second resources include a calculation resource having a calculation function, a measurement resource for measuring at least one of voltage, current, and impedance, and an algorithm for estimating the remaining battery charge.

3. The remaining battery charge estimating system according to claim 1,
   wherein the remaining battery charge estimation and resource determination component estimates the remaining battery charge by combining the first resources and the second resources.

4. The remaining battery charge estimation system according to claim 1,
   wherein the remaining battery charge estimation and resource determination component selects the first resources and the second resources on the basis of any one of a remaining battery charge estimation accuracy, estimation speed, and power consumption required for estimation.

5. The remaining battery charge estimation system according to claim 1,
   wherein the storage component stores the first resources and the second resources determined to be used for estimating the remaining battery charge in the remaining battery charge estimation and resource determination component.

6. The remaining battery charge estimation system according to claim 1,
   wherein the connected device is a charging device.

7. The remaining battery charge estimation system according to claim 1,
   wherein the connected device is any one of a vehicle, a household appliance, and an electric power tool.

8. The remaining battery charge estimation system according to claim 7,
   wherein the vehicle includes an electric motorcycle, an electric bicycle, an electrically assisted bicycle, an electric automobile, and a PHV (plug-in hybrid vehicle).

9. A remaining battery charge estimation method for estimating a remaining battery charge of a battery pack, the method comprising:
   a connection detection step of detecting a connection of the battery pack and a connected device to which the battery pack is connected;
   a connected device identification step of identifying the connected device; and
   a remaining battery charge estimation and resource determination step of determining a first resources installed in the battery pack and a second resources installed in the connected device, which are used for estimating the remaining battery charge, on the basis of information related to the connected device identified in the connected device identification step.

* * * * *